(12) United States Patent
Shafer

(10) Patent No.: US 7,592,883 B2
(45) Date of Patent: Sep. 22, 2009

(54) DUAL BANDSTOP FILTER WITH ENHANCED UPPER PASSBAND RESPONSE

(75) Inventor: Steven K. Shafer, Chittenango, NY (US)

(73) Assignee: John Mezzalingua Associates, Inc., East Syracuse, NY (US)

( * ) Notice: Subject to any disclaimer, the term of this patent is extended or adjusted under 35 U.S.C. 154(b) by 0 days.

(21) Appl. No.: 12/249,909

(22) Filed: Oct. 11, 2008

(65) Prior Publication Data

US 2009/0039980 A1     Feb. 12, 2009

Related U.S. Application Data

(62) Division of application No. 11/677,637, filed on Feb. 22, 2007.

(51) Int. Cl.
*H03H 7/00* (2006.01)
*H03H 7/01* (2006.01)
(52) U.S. Cl. .................. 333/176; 333/132; 333/175
(58) Field of Classification Search .............. 333/176, 333/132, 175, 185, 172
See application file for complete search history.

(56) References Cited

U.S. PATENT DOCUMENTS 3,806,813 A * 4/1974 Eller .................... 725/128

* cited by examiner

*Primary Examiner*—Daniel D Chang
(74) *Attorney, Agent, or Firm*—Christopher R. Pastel; Pastel Law Firm

(57) ABSTRACT

A dual bandstop filter affects frequencies in a lower passband, first and second stopbands separated by a middle passband, and an upper passband. The filter includes two legs. In one version, one leg is a highpass filter while the other leg is a bandstop filter outputting into a lowpass filter. In a second version, one leg is a lowpass filter while the other leg is highpass filter outputting into a bandstop filter. The first version is preferred when the upper value of the lower passband is around 100 MHz or less, while the second version is preferred when the upper value of the lower passband is around 100 MHz or more. In a third version, one leg is a highpass filter while the other leg is a bandstop filter sandwiched between two lowpass filters, preventing second resonances from the lowpass filter from interfering with desired frequencies in the upper passband.

4 Claims, 7 Drawing Sheets

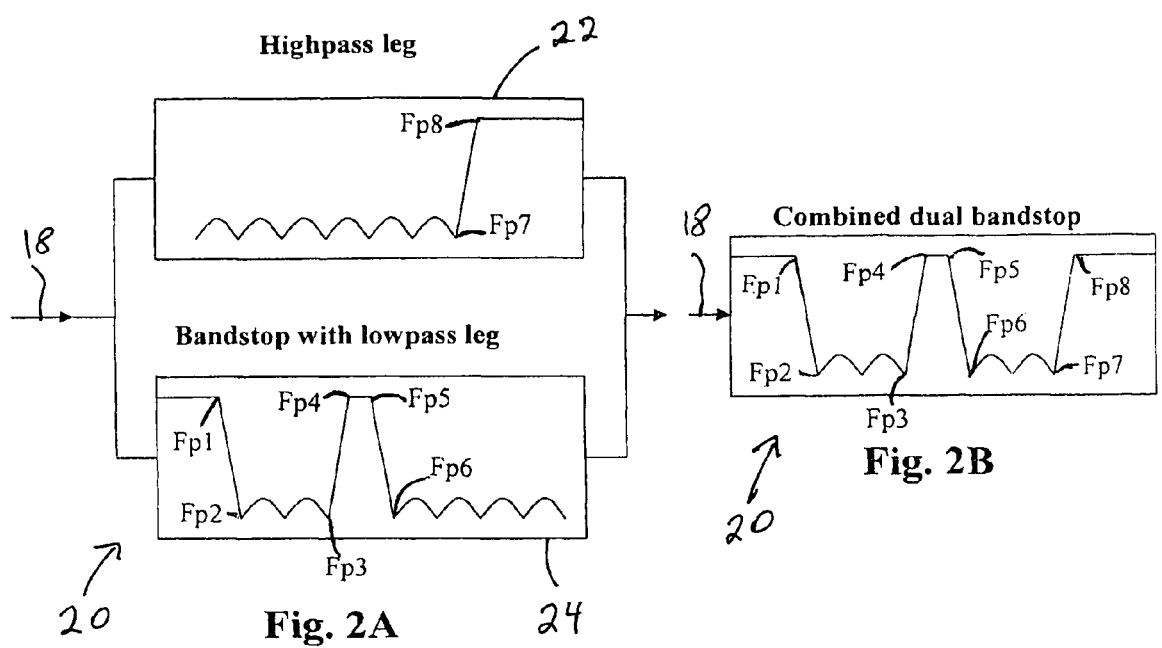

DUAL BANDSTOP FILTER WITH ENHANCED UPPER PASSBAND RESPONSE

This application is a divisional of and claims priority from co-pending U.S. patent application Ser. No. 11/677,637 filed on Feb. 22, 2007 and entitled "DUAL BANDSTOP FILTER WITH ENHANCED UPPER PASSBAND RESPONSE."

FIELD OF THE INVENTION

This invention relates generally to the field of filter circuits used in cable television (CATV) applications, and more particularly to a dual bandstop filter with an enhanced upper passband response.

BACKGROUND OF THE INVENTION

Bandstop or "notch" filters are commonly employed in the CATV industry to block transmission of signals in a specified frequency range. For example, certain channels may be designated as premium channels, requiring payment of a fee from the subscriber in order to receive the signals carrying information representing such channels. If the service is not ordered, i.e., the fee is not paid, an appropriate filter is installed in the cable line coming into the non-paying premises. This is but one of the more traditional uses of bandstop filters, i.e., as a so-called trap.

It is desirable that bandstop filters be as compact as possible commensurate with quality performance of their intended function. It is also desirable, of course, that the filters be as inexpensive as possible, again while maintaining high performance criteria. Passband insertion and return loss is of critical importance in such filters, particularly in the digital signal market, which is steadily growing in significance.

The traditional design of a dual bandstop filter consists of multiple notch filters in series to remove two segments, the stopbands, while preserving the lower, middle, and upper passband signals. A drawback to the traditional design is that the second resonance of the primary notch interferes with the frequencies in the upper passband signal. An additional drawback is that increasing the sharpness of the cutoff by adding more sections increases the insertion loss, as well as increasing the number of circuit components.

SUMMARY OF THE INVENTION

Briefly stated, an enhanced dual bandstop filter affects frequencies in a lower passband, first and second stopbands separated by a middle passband, and an upper passband. The filter includes two legs. In one version, one leg is a highpass filter while the other leg is a bandstop filter outputting into a lowpass filter. In a second version one leg is a lowpass filter while the other leg is highpass filter outputting into a bandstop filter. The first version is preferred when the upper value of the lower passband is around 100 MHz or less, while the second version is preferred when the upper value of the lower passband is around 100 MHz or more. In a third version, one leg is a highpass filter while the other leg is a bandstop filter sandwiched between two lowpass filters, preventing second resonances from the lowpass filter from interfering with desired frequencies in the upper passband.

According to an embodiment of the invention, an enhanced dual bandstop filter which affects frequencies in a lower passband, first and second stopbands separated by a middle passband, and an upper passband, includes first and second legs connected in parallel; when an upper value of the lower passband is about 100 MHz or less, the first leg is a first highpass filter while the second leg is a first bandstop filter outputting into a first lowpass filter; and when the upper value of the lower passband is about 100 MHz or more, the first leg is a second lowpass filter while the second leg is a second highpass filter outputting into a second bandstop filter.

According to an embodiment of the invention, an enhanced dual bandstop filter which affects frequencies in a lower passband, first and second stopbands separated by a middle passband, and an upper passband, includes first and second legs connected in parallel; the first leg including a highpass circuit; and the second leg including a bandstop circuit in series between a plurality of lowpass circuits.

According to an embodiment of the invention, a method of making an enhanced dual bandstop filter which affects frequencies in a lower passband, first and second stopbands separated by a middle passband, and an upper passband, includes the steps of: (a) providing first and second circuit legs; (b) connecting the first and second legs in parallel; (c) making the first leg a highpass filter when an upper value of the lower passband is about 100 MHz or less, and making the second leg a first bandstop filter outputting into a first lowpass filter; and (d) making the first leg a second lowpass filter when the upper value of the lower passband is about 100 MHz or more, and making the second leg a second highpass filter outputting into a second bandstop filter.

According to an embodiment of the invention, a method of making an enhanced dual bandstop filter which affects frequencies in a lower passband, first and second stopbands separated by a middle passband, and an upper passband, includes the steps of: (a) providing first and second circuit legs; (b) connecting the first and second legs in parallel; (c) making the first leg a highpass circuit; and (d) making the second leg a bandstop circuit in series between a plurality of lowpass circuits.

BRIEF DESCRIPTION OF THE DRAWINGS

FIG. 2A shows a top level schematic of a first embodiment of the present invention, showing the individual legs of the circuit.

FIG. 2B shows a top level schematic of the first embodiment, showing the effect of the combined circuit of FIG. 2A.

DETAILED DESCRIPTION OF THE PREFERRED EMBODIMENT

Figure 1A:
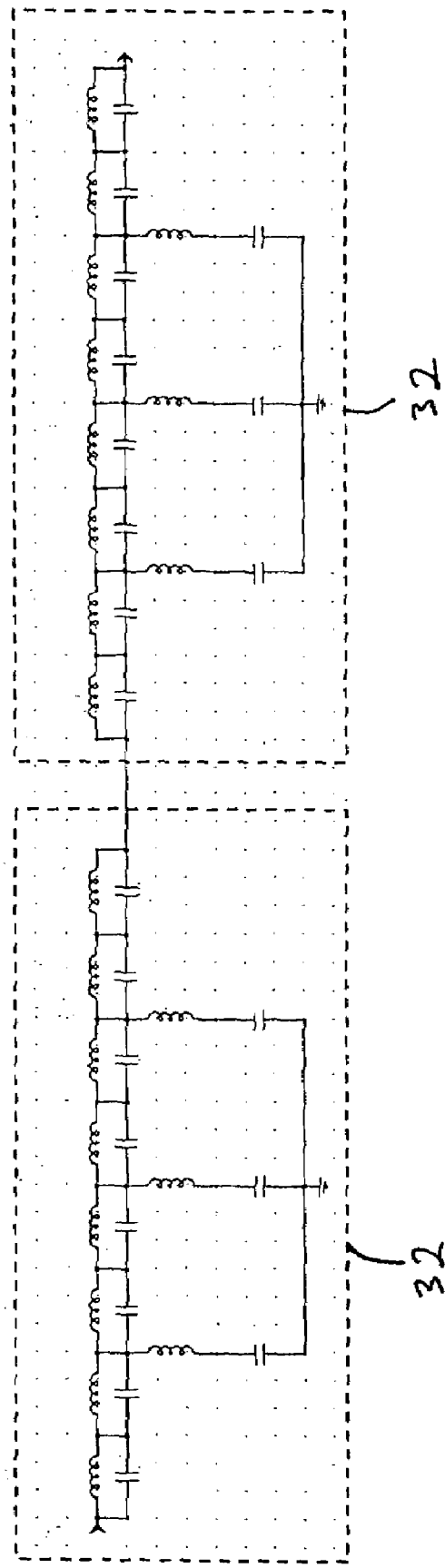
FIG. 1A shows a schematic of a prior art dual bandstop filter.
Figure 1B:
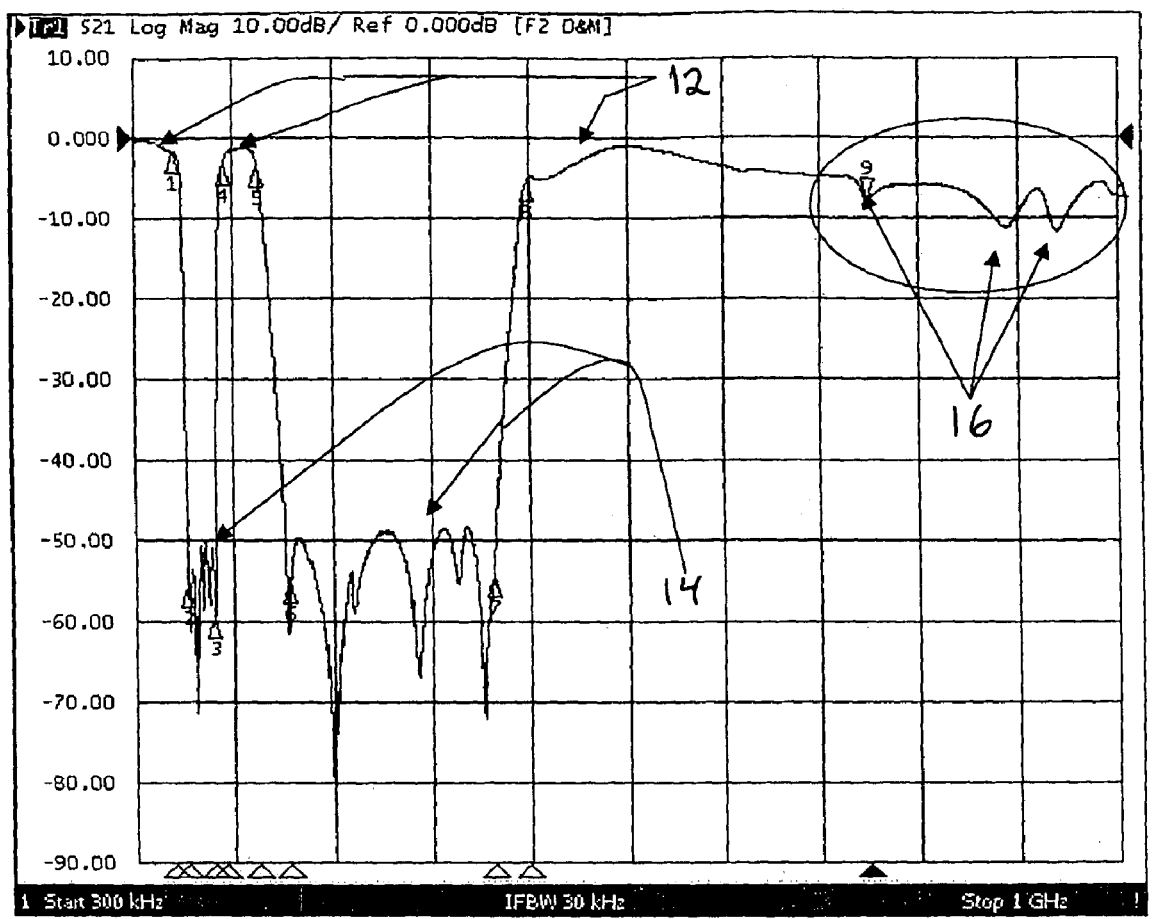
FIG. 1B shows a frequency graph of the output of the filter of FIG. 1A.

Referring to FIG. 1A, a schematic is shown of a prior art dual bandstop filter 10 which includes two bandstop filters 32 in series. FIG. 1B shows a frequency response graph produced by filter 10. Note in FIG. 1B that there are a plurality of passbands 12 which have a signal strength of 0 to −5 dB. Two stopbands 14 have signal strengths generally in the −50 dB to −70 dB range, effectively preventing signals with frequencies falling within stopbands 14 from passing through the circuit. A plurality of second resonances 16 within an upper range of passbands 12 interfere with the frequencies in the upper range, decreasing their signal strength to the −5 dB to −10 dB range. The prior art design of FIG. 1A works well within a narrow band, for instance, one only 200 MHz wide, but increasing the bandwidth leads to problems such as increasing the insertion loss and requiring more components.

Referring to FIG. 2A, a first embodiment of the invention is shown, consisting of a dual bandstop filter circuit 20, which includes a highpass leg 22 and a combined bandstop and lowpass leg 24. An input line 18 carries signals which may range in frequency from 0 to 3 GHZ. All signals enter highpass leg 22 and combined bandstop and lowpass leg 24. Leg 22 and leg 24 are each preferably composed of a plurality of components (inductors and capacitors) connected in electrically operative relation, preferably in a plurality of stages or sections each containing an inductor and a capacitor to establish a resonant circuit. Additional sections may be added depending on how sharp a cutoff is desired. The graphical representations in FIGS. 2A-2B indicate generally the energy levels of signals at the indicated frequencies.

In combined bandstop and lowpass leg 24, selecting the proper values of components connected in a particular configuration results in signals having frequencies below a value Fp1 passing through leg 24; this region is termed a passband. Such selection of values is considered to be within the skill of one of ordinary skill in the art. Signals with frequencies having values between a value Fp2 and Fp3 are prevented from passing through leg 24; this region is termed a stopband. Signals with frequencies having values between Fp4 and Fp5 pass through leg 24; this region is a also termed a passband. Signals with frequencies having values above a value Fp6 are prevented from passing through leg 24; this region is termed a stopband. In highpass leg 22, signals with frequencies below a value Fp7 are prevented from passing through leg 22; this region is termed a stopband. Signals with frequencies above Fp8 pass through leg 22; this region is termed a passband.

Referring to FIG. 2B, the effects of the combination of highpass leg 22 with bandstop and lowpass leg 24 are shown. Note that there is now a defined stopband between values Fp6 and Fp7 in addition to the defined stopband between Fp2 and Fp3.

Figure 3:
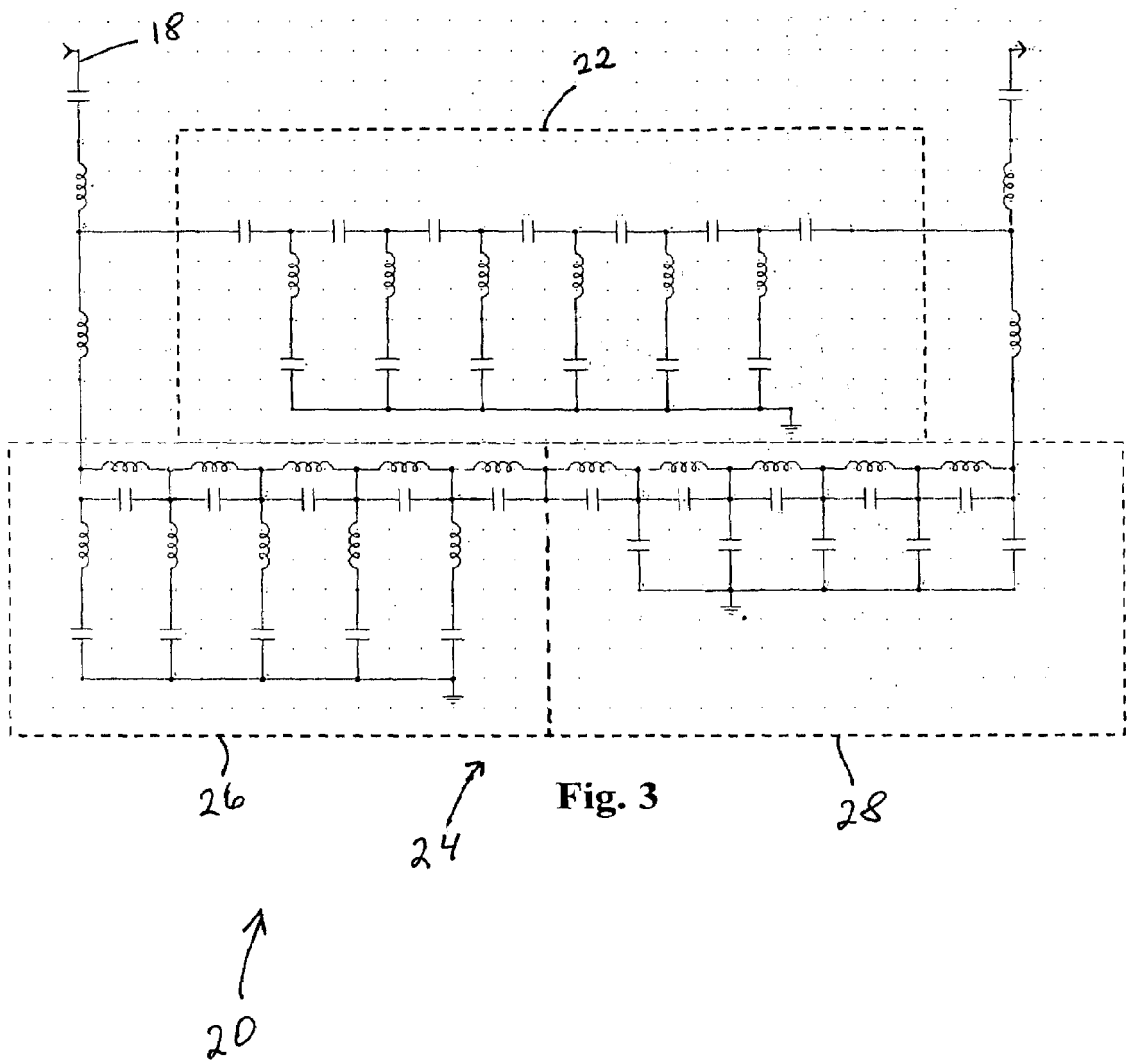
FIG. 3 shows a schematic of a circuit implementing the first embodiment of the present invention.

Referring to FIG. 3, a schematic diagram implementing dual bandstop filter circuit 20 is shown, with the preferred circuit components of highpass leg 22 and combined bandstop and lowpass filter leg 24 shown. Combined bandstop and lowpass filter leg 24 preferably consists of a bandstop filter 26 and a lowpass filter 28. Bandstop filter 26 is shown here with a plurality of series notch filters and shunt notch filters. The signal output from bandstop filter 26 enters lowpass filter 28, which passes only those frequencies lower than the value of Fp5. The frequency graph of the embodiment of FIG. 3 is similar to the frequency graph of FIG. 1, but filter circuit 20 works well for bandwidths exceeding 200 MHz but with far less insertion loss than prior art circuit 10 of FIG. 1A. Filter circuit 20 also requires fewer components than would be the case from adding bandstop sections to prior art circuit 10 of FIG. 1A.

Figures 4A, 4B:
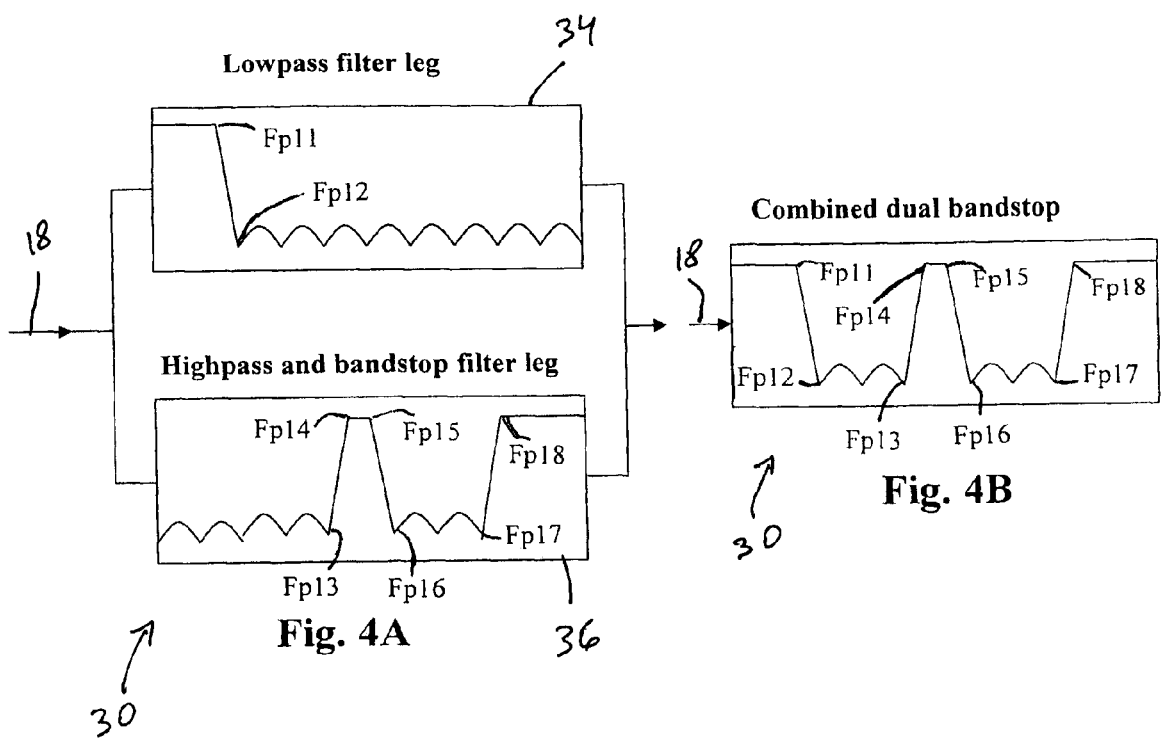
FIG. 4A shows a top level schematic of a second embodiment of the present invention, showing the individual legs of the circuit.
FIG. 4B shows a top level schematic of the second embodiment, showing the effect of the combined circuit of FIG. 4A.

Referring to FIG. 4A, a second embodiment of the invention is shown, consisting of a dual bandstop filter circuit 30, which includes a lowpass leg 34 and a combined highpass and bandstop leg 36. Input line 18 carries signals which may range in frequency from 0 to 3 GHZ. All signals enter lowpass leg 34 and combined highpass and bandstop leg 36. Leg 34 and leg 36 are each composed of a plurality of components (inductors and capacitors) connected in electrically operative relation, preferably in a plurality of stages or sections each containing an inductor and a capacitor to establish a resonant circuit. Additional sections may be added depending on how sharp a cutoff is desired. The graphical representations in FIGS. 4A-4B indicate generally the energy levels of signals at the indicated frequencies.

In lowpass leg 34, selecting the proper values of components, as is within the capability of one of ordinary skill in the art, connected in a particular configuration results in signals having frequencies below a value Fp11 passing through leg 34; this region is termed a passband. In combined highpass and bandstop leg 36, signals with frequencies having values less than a value Fp14 are prevented from passing through leg 36; this region is termed a stopband. Signals with frequencies having values between Fp14 and Fp15 pass through leg 36; this region is termed a passband. Signals with frequencies having values between a value Fp16 and a value Fp17 are prevented from passing through leg 36; this region is termed a stopband. Signals with frequencies above Fp18 pass through leg 22; this region is termed a passband.

Referring to FIG. 4B, the effects of the combination of lowpass leg 34 with highpass and bandstop leg 36 are shown. Note that there is now a defined stopband between values Fp12 and Fp13 in addition to the defined stopband between Fp16 and Fp17.

Figure 5:
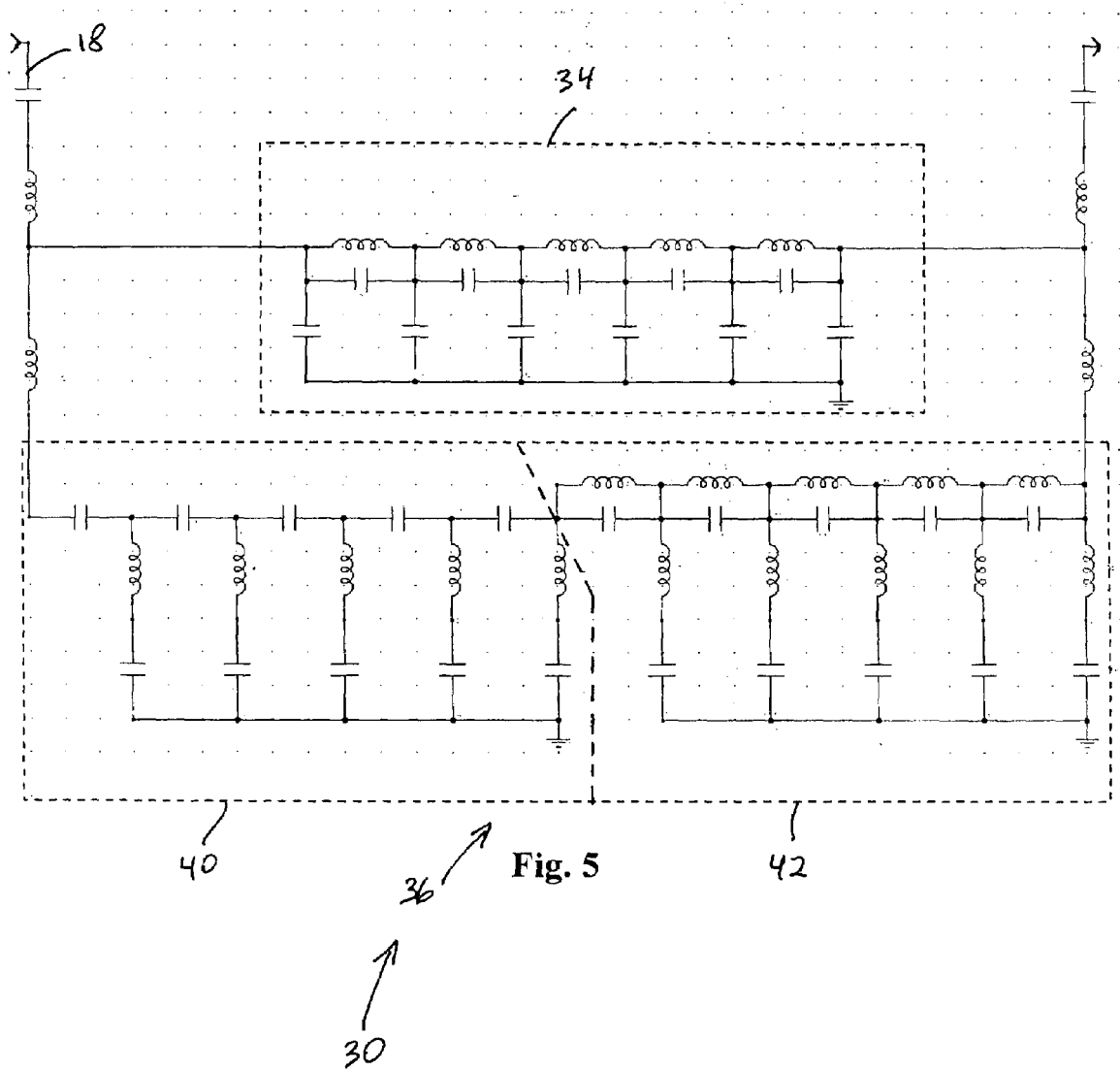
FIG. 5 shows a schematic of a circuit implementing the second embodiment of the present invention.

Referring to FIG. 5, a schematic diagram implementing dual bandstop filter circuit 30 is shown, with the preferred circuit components of lowpass leg 34 and combined highpass and bandstop filter leg 36 shown. Combined highpass and bandstop filter leg 36 preferably consists of a highpass filter 40 and a bandstop filter 42. Bandstop filter 42 is shown here with a plurality of series notch filters and shunt notch filters. The signal output from highpass filter 40 enters bandstop filter 42. The frequency graph of the embodiment of FIG. 5 is similar to the frequency graph of FIG. 1, but filter circuit 30 works well for bandwidths exceeding 200 MHz but with far less insertion loss than prior art circuit 10 of FIG. 1A. Filter circuit 30 also requires fewer components than would be the case from adding bandstop sections to prior art circuit 10 of FIG. 1A.

The embodiment of FIG. 3 is preferably used when value Fp1 is approximately 100 MHz or less, while the embodiment of FIG. 5 is preferably used when value Fp11 is approximately 100 MHz or more.

Figure 6:
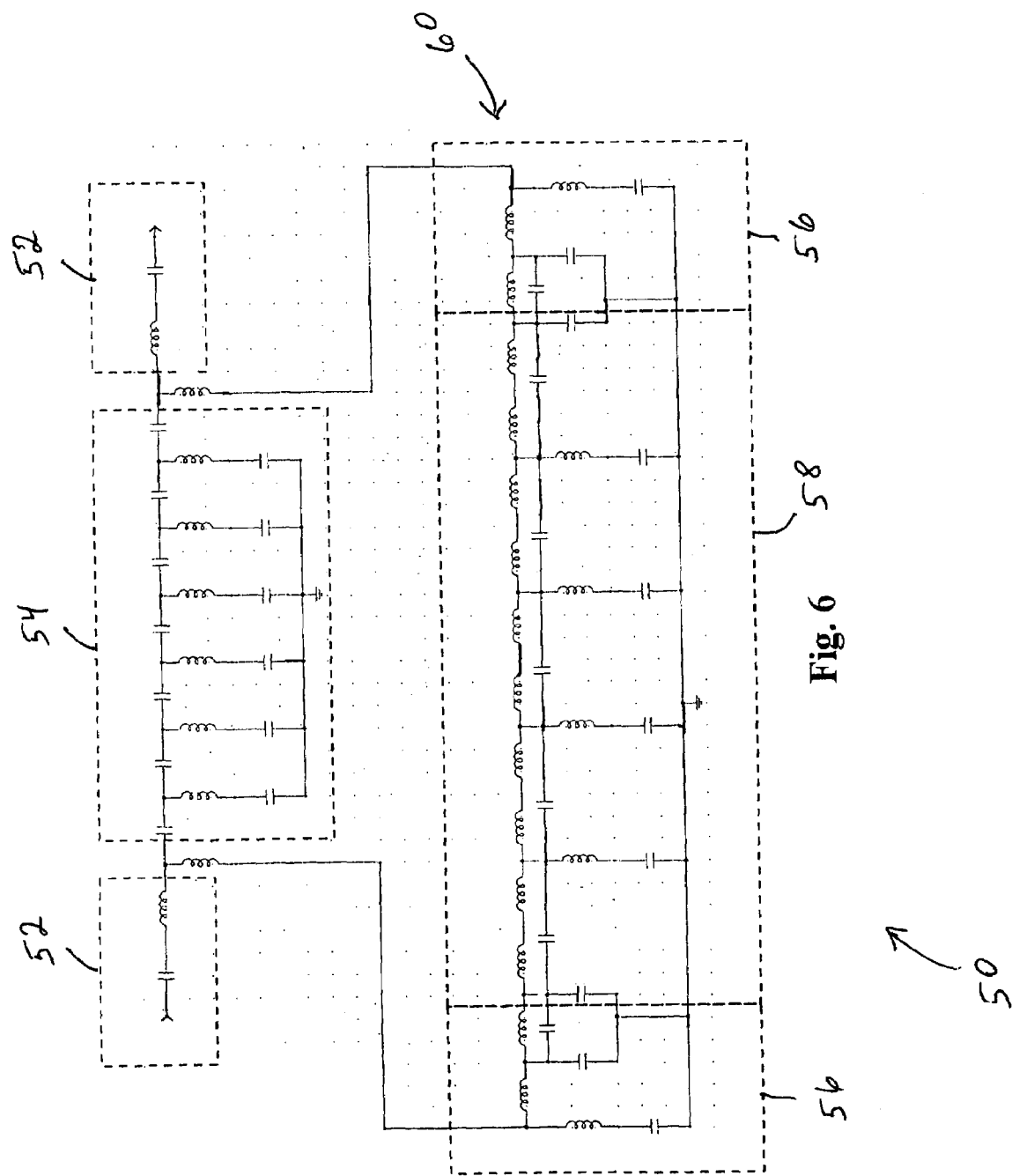
FIG. 6 shows a schematic of a circuit implementing a third embodiment of the present invention.

Referring to FIG. 6, a diplex filter circuit 50 includes a highpass leg 54 in parallel with a lowpass/bandstop/lowpass leg 60, which preferably consists of a bandstop filter 58 centered in series between two lowpass filters 56. Highpass leg 54, lowpass filters 56, and bandstop filter 58 are preferably composed of a plurality of components (inductors and capacitors) connected in electrically operative relation, preferably in a plurality of stages or sections each containing an inductor and a capacitor to establish a resonant circuit. Additional sections may be added depending on how sharp a cutoff is desired.

A plurality of surge protection circuits 52 preferably provide protection from the effects of lightning, Leg 60 of circuit 50 isolates the second resonances and prevents them from entering highpass leg 54. Thus, the frequency graph for the circuit of FIG. 6 looks like the frequency graph of FIG. 1A but without the second resonances 16.

While the present invention has been described with reference to a particular preferred embodiment and the accompanying drawings, it will be understood by those skilled in the art that the invention is not limited to the preferred embodi-

What is claimed is:

1. A dual bandstop filter which affects frequencies in a lower passband, first and second stopbands separated by a middle passband, and an upper passband, comprising:
   first and second legs connected in parallel;
   when an upper value of the lower passband is about 100 MHz or less, the first leg is a first highpass filter while the second leg is a first bandstop filter outputting into a first lowpass filter; and
   when the upper value of the lower passband is about 100 MHz or more, the first leg is a second lowpass filter while the second leg is a second highpass filter outputting into a second bandstop filter.

2. A dual bandstop filter according to claim 1, wherein all circuit components consist of capacitors and inductors.

3. A method of making a dual bandstop filter which affects frequencies in a lower passband, first and second stopbands separated by a middle passband, and an upper passband, comprising the steps of:
   providing first and second circuit legs;
   connecting the first and second legs in parallel;
   making the first leg a highpass filter when an upper value of the lower passband is about 100 MHz or less, and making the second leg a first bandstop filter outputting into a first lowpass filter; and
   making the first leg a second lowpass filter when the upper value of the lower passband is about 100 MHz or more, and making the second leg a second highpass filter outputting into a second bandstop filter.

4. A method according to claim 3, comprising the further step of making all circuit components of capacitors and inductors.

* * * * *